US011374039B2

(12) United States Patent
Cho et al.

(10) Patent No.: US 11,374,039 B2
(45) Date of Patent: Jun. 28, 2022

(54) ARRAY SUBSTRATE AND METHOD OF MANUFACTURING THE SAME

(71) Applicants: HKC Corporation Limited, Guangdong (CN); Chongqing HKC Optoelectronics Technology Co., Ltd., Chongqing (CN)

(72) Inventors: En-Tsung Cho, Chongqing (CN); Feng Yun Yang, Chongqing (CN)

(73) Assignees: HKC CORPORATION LIMITED, Shenzhen (CN); CHONGQING HKC OPTOELECTRONICS TECHNOLOGY CO., LTD., Chongqing (CN)

(*) Notice: Subject to any disclaimer, the term of this patent is extended or adjusted under 35 U.S.C. 154(b) by 0 days.

(21) Appl. No.: 16/650,234

(22) PCT Filed: Dec. 12, 2017

(86) PCT No.: PCT/CN2017/115605
§ 371 (c)(1),
(2) Date: Mar. 24, 2020

(87) PCT Pub. No.: WO2019/056591
PCT Pub. Date: Mar. 28, 2019

(65) Prior Publication Data
US 2020/0235140 A1    Jul. 23, 2020

(30) Foreign Application Priority Data
Sep. 25, 2017    (CN) .......................... 201710874626.9

(51) Int. Cl.
*H01L 27/12*    (2006.01)

(52) U.S. Cl.
CPC ...... *H01L 27/1288* (2013.01); *H01L 27/1255* (2013.01)

(58) Field of Classification Search
CPC ........................ H01L 27/1288; H01L 27/1255
(Continued)

(56) References Cited

U.S. PATENT DOCUMENTS 7,956,531 B2 *  6/2011  Smith ................. H01L 27/3244
                                                         313/505
8,575,614 B2 * 11/2013  Makita ................ H01L 27/1229
                                                         257/72

(Continued)

FOREIGN PATENT DOCUMENTS

| CN | 101281887 A | 10/2008 |
|----|-------------|---------|
| CN | 101325181 A | 12/2008 |
| CN | 102354695 A | 2/2012  |

*Primary Examiner* — Ori Nadav
(74) *Attorney, Agent, or Firm* — Muncy, Geissler, Olds & Lowe, P.C.

(57) ABSTRACT

This disclosure provides an array substrate and a method of manufacturing the same. The method includes: forming a switch element; etching on an extension of a gate insulation layer to obtain a second amorphous silicon layer, a second N-type amorphous silicon layer and a light sensing metal at the same time to form a photosensor; forming a light sensing layer and a passivation layer on a source metal, a drain metal, and the light sensing metal; and forming a first light sensing layer and a first passivation layer on the source metal and the drain metal, and forming a second light sensing layer and a second passivation layer on the light sensing metal by using a second mask.

4 Claims, 4 Drawing Sheets

(58) Field of Classification Search
USPC .......................................................... 257/66
See application file for complete search history.

(56) References Cited

U.S. PATENT DOCUMENTS

| | | | | |
|---|---|---|---|---|
| 2007/0040099 | A1* | 2/2007 | Yokoyama | H01L 31/1085 250/208.1 |
| 2009/0280606 | A1* | 11/2009 | Shih | H01L 31/095 438/155 |
| 2009/0309821 | A1* | 12/2009 | Tanno | H01L 27/326 345/87 |
| 2015/0295006 | A1* | 10/2015 | Chen | H01L 29/7869 257/43 |
| 2021/0082969 | A1* | 3/2021 | He | H01L 27/1233 |

* cited by examiner

ARRAY SUBSTRATE AND METHOD OF MANUFACTURING THE SAME

BACKGROUND

Technology Field

This disclosure relates to a technical field of a display, and more particularly to an array substrate and a method of manufacturing the same.

Description of Related Art

The display has many advantages, such as the slim body, the power-saving property, the radiation less property and the like, and has been widely used. Most of the displays in the existing market are backlight displays, which include a display panel and a backlight module. The working principle of the display panel is to refract the light rays from the backlight module to produce a frame by placing liquid crystal molecules in two parallel substrates, and by applying a driving voltage to the two substrates to control the orientations of the liquid crystal molecules.

In addition, in order to make the array substrate be capable of sensing the intensity of the external light to perform the self-regulations of the brightness and the contrast ratio, photosensors are provided on some array substrates. However, the difference between the photosensor and the switch element disables both of them from sharing a mask, thereby increasing the mask process, so that the production efficiency is not high.

It should be noted that the above-mentioned description of the technical background is merely for the purpose of facilitating the clear and complete descriptions of the technical solutions of this disclosure, and is provided for the understanding of those skilled in the art. The above-mentioned technical solutions are considered to be well known to those skilled in the art merely because these schemes are set forth in the background of this disclosure.

SUMMARY

In view of the above-identified defects mentioned in the related art, the technical problem to be solved by this disclosure is to provide an array substrate, which is capable of saving the mask process and increasing the production efficiency, and a method of manufacturing the array substrate.

An objective of this disclosure is achieved by providing a method of manufacturing an array substrate, comprising: forming a gate metal on a substrate, and forming a gate insulating layer on the gate metal; forming an amorphous silicon layer, an N-type amorphous silicon layer and a metal layer on the gate insulating layer; forming a photoresist layer on the metal layer, and forming a first amorphous silicon layer, a first N-type amorphous silicon layer, and a source metal and a drain metal oppositely disposed on the gate metal through a first mask to form a switch element; etching on an extension of the gate insulation layer to obtain a second amorphous silicon layer, a second N-type amorphous silicon layer and a light sensing metal at the same time to form a photosensor; forming a light sensing layer and a passivation layer on the source metal, the drain metal, and the light sensing metal; and forming a first light sensing layer and a first passivation layer on the source metal and the drain metal, and forming a second light sensing layer and a second passivation layer on the light sensing metal by using a second mask.

Optionally, the step of forming the first light sensing layer and the first passivation layer on the source metal and the drain metal, and forming the second light sensing layer and the second passivation layer on the light sensing metal by using a second mask further comprises: etching through the second mask to clean the light sensing layer and the passivation layer between the switch element and the photosensor to form the first light sensing layer and the first passivation layer on the source metal and the drain metal, and to form the second light sensing layer and the second passivation layer on the light sensing metal at the same time.

Optionally, the photoresist layer is cleared, a first electrode layer is formed on the first passivation layer, and a second electrode layer is formed on the second passivation layer through a same process.

Optionally, the step that the photoresist layer is cleared, the first electrode layer is formed on the first passivation layer, and the second electrode layer is formed on the second passivation layer through the same process comprises: etching to form a groove penetrating through the first light sensing layer and extending to an upper surface of the drain metal on the first passivation layer corresponding to the drain metal; and forming the first electrode layer fully filled into the groove and extending to an upper surface of the first passivation layer.

Optionally, the step that the photoresist layer is cleared, the first electrode layer is formed on the first passivation layer, and the second electrode layer is formed on the second passivation layer through the same process comprises: etching the second passivation layer to form a first passivation block and a second passivation block, which are disposed on two ends of an upper surface of the second light sensing layer, and are separately and correspondingly disposed through a through slot; and forming the second electrode layer on the first passivation block, the second passivation block and the through slot.

Optionally, the step that the photoresist layer is cleared, the first electrode layer is formed on the first passivation layer, and the second electrode layer is formed on the second passivation layer through the same process comprises: etching through a same process to form a groove penetrating through the first light sensing layer and extending to an upper surface of the drain metal on the first passivation layer corresponding to the drain metal; while etching the second passivation layer to form a first passivation block and a second passivation block, which are disposed on two ends of an upper surface of the second light sensing layer, and are separately and correspondingly disposed through a through slot; and clearing the photoresist layer through the same process to form the first electrode layer on the first passivation layer, and to form the second electrode layer on the second passivation layer.

Optionally, the second mask is a halftone mask.

This disclosure also provides an array substrate, comprising: a substrate; a switch element disposed on the substrate; a photosensor disposed on the substrate and one side of the switch element; a light sensing metal disposed at a lower portion of the photosensor; the switch element comprises a source metal and a drain metal on the same layer as the light sensing metal; the switch element comprises a first light sensing layer formed on the source metal and the drain metal, and a first passivation layer formed on the first light sensing layer; the photosensor comprises a second light sensing layer formed on the light sensing metal, and a second passivation layer formed on the second light sensing layer; the first light sensing layer and the second light sensing layer are on the same layer, and the first passivation layer and the second passivation layer are on the same layer; the switch element comprises a gate metal; the photosensor comprises a second amorphous silicon layer and a second N-type amorphous silicon layer formed on an extension of the gate insulating layer, and the light sensing metal is formed on the second N-type amorphous silicon layer; a first amorphous silicon layer and the second amorphous silicon layer are on the same layer, and a first N-type amorphous silicon layer and the second N-type amorphous silicon layer are on the same layer; the first passivation layer is formed with a first electrode layer corresponding to the drain metal; the first passivation layer is provided with a groove corresponding to the drain metal, and the groove penetrates through the first light sensing layer from an upper surface of the first passivation layer, and extends to an upper surface of the drain metal; the first electrode layer is fully filled into the groove and extends to the upper surface of the first passivation layer; a second electrode layer is formed on the second passivation layer; the second passivation layer comprises a first passivation block and a second passivation block, which are disposed on two ends of an upper surface of the second light sensing layer, and are separately and correspondingly disposed through a through slot; and the second electrode layer is formed on the first passivation block, the second passivation block and the through slot.

This disclosure also provides an array substrate, comprising: a substrate; a switch element disposed on the substrate; a photosensor disposed on the substrate and one side of the switch element; and a light sensing metal disposed at a lower portion of the photosensor; the switch element comprises a source metal and a drain metal on the same layer as the light sensing metal.

Optionally, the switch element comprises a first light sensing layer formed on the source metal and the drain metal, and a first passivation layer formed on the first light sensing layer; the photosensor comprises a second light sensing layer formed on the light sensing metal, and a second passivation layer formed on the second light sensing layer; the first light sensing layer and the second light sensing layer are on the same layer, and the first passivation layer and the second passivation layer are on the same layer.

Optionally, the switch element comprises a gate metal, a gate insulating layer is formed on the gate metal, a first amorphous silicon layer and a first N-type amorphous silicon layer are successively formed on the gate insulating layer, and the source metal and the drain metal are formed on the first N-type amorphous silicon layer; the photosensor comprises a second amorphous silicon layer and a second N-type amorphous silicon layer formed on an extension of the gate insulating layer, and the light sensing metal is formed on the second N-type amorphous silicon layer; the first amorphous silicon layer and the second amorphous silicon layer are on the same layer, and the first N-type amorphous silicon layer and the second N-type amorphous silicon layer are on the same layer.

Optionally, the first passivation layer is formed with a first electrode layer corresponding to the drain metal.

Optionally, the first passivation layer is provided with a groove corresponding to the drain metal, and the groove penetrates through the first light sensing layer from an upper surface of the first passivation layer, and extends to an upper surface of the drain metal.

Optionally, a second electrode layer is formed on the second passivation layer.

Optionally, the second passivation layer comprises a first passivation block and a second passivation block, which are disposed on two ends of an upper surface of the second light sensing layer, and are separately and correspondingly disposed through a through slot; and the second electrode layer is formed on the first passivation block, the second passivation block and the through slot.

Optionally, the first passivation layer is formed with a first electrode layer corresponding to the drain metal; the first passivation layer is provided with a groove corresponding to the drain metal, and the groove penetrates through the first light sensing layer from an upper surface of the first passivation layer, and extends to an upper surface of the drain metal; the first electrode layer is fully filled into the groove and extends to the upper surface of the first passivation layer; a second electrode layer is formed on the second passivation layer; the second passivation layer comprises a first passivation block and a second passivation block, which are disposed on two ends of an upper surface of the second light sensing layer, and are separately and correspondingly disposed through a through slot; the second electrode layer is formed on the first passivation block, the second passivation block and the through slot; and the first electrode layer and the second electrode layer are on a same layer.

Optionally, a first electrode layer is formed on the first passivation layer, and a second electrode layer is formed on the second passivation layer; and the first electrode layer and the second electrode layer are on a same layer.

Optionally, the first passivation layer is provided with a groove corresponding to the drain metal, and the groove penetrates through the first light sensing layer from an upper surface of the first passivation layer, and extends to an upper surface of the drain metal; and the first electrode layer is fully filled into the groove and extends to the upper surface of the first passivation layer.

Optionally, the second passivation layer comprises a first passivation block and a second passivation block, which are disposed on two ends of an upper surface of the second light sensing layer, and are separately and correspondingly disposed through a through slot; the second electrode layer is formed on the first passivation block, the second passivation block and the through slot; and the first electrode layer and the second electrode layer are on a same layer.

Optionally, the first passivation layer is provided with a groove corresponding to the drain metal, and the groove penetrates through the first light sensing layer from an upper surface of the first passivation layer, and extends to an upper surface of the drain metal; the first electrode layer is fully filled into the groove and extends to the upper surface of the first passivation layer; the second passivation layer comprises a first passivation block and a second passivation block, which are disposed on two ends of an upper surface of the second light sensing layer, and are separately and correspondingly disposed through a through slot; the second electrode layer is formed on the first passivation block, the second passivation block and the through slot; and the first electrode layer and the second electrode layer are on a same layer.

In the method of manufacturing the array substrate of this disclosure, the array substrate is provided with a photosensor, and the photosensor is disposed beside the switch element. Thus, the array substrate can sense the environment changes through the photosensor. More particularly, the intensity change of the external light can be sensed. Thus, when the light ray is strong, the display can automatically adjust to increase the brightness to prevent the too dark display frame from being seen. When the light ray is weak, the brightness is correspondingly darkened to prevent the too bright frame from harshening and hurting the eyes. The switch element comprises a source metal and a drain metal, the photosensor comprises a light sensing metal, and both of them are on the same layer. Thus, when the substrate process is being performed, both of them may be formed at a time, so that the mask usage and the process steps can be decreased to increase the production efficiency. In addition, the switch element comprises a first light sensing layer and a first passivation layer, and the photosensor comprises a second light sensing layer and a second passivation layer, wherein both of them are disposed on the same layer. When the first light sensing layer, the first passivation layer, the second light sensing layer and the second passivation layer are formed, the structure of the same layer on both sides can be completed through one mask process, thereby decreasing the process waste and increasing the production efficiency.

Specific structures and function details disclosed herein are only for the illustrative purpose for describing the exemplary embodiment of this disclosure. However, this disclosure can be specifically implemented through many replacements, and should not be explained as being restricted to only the embodiment disclosed herein.

It should also be understood that the terms "comprising" and/or "including" are used herein to describe the features to describe the presence of stated features, integers, steps, operations, units and/or elements without excluding the presence or addition of one or more other features, integers, steps, operations, units, elements, and/or combinations thereof.

BRIEF DESCRIPTION OF THE DRAWINGS

The disclosure will become more fully understood from the detailed description and accompanying drawings, which are given for illustration only, and thus are not limitative of the present disclosure, and wherein.

DETAILED DESCRIPTION OF THE DISCLOSURE

The embodiments of the disclosure will be apparent from the following detailed description, which proceeds with reference to the accompanying drawings, wherein the same references relate to the same elements. Although the disclosure has been described with reference to specific embodiments, this description is not meant to be construed in a limiting sense. Various modifications of the disclosed embodiments, as well as alternative embodiments, will be apparent to persons skilled in the art. It is, therefore, contemplated that the appended claims will cover all modifications that fall within the true scope of the disclosure.

Figure 1:
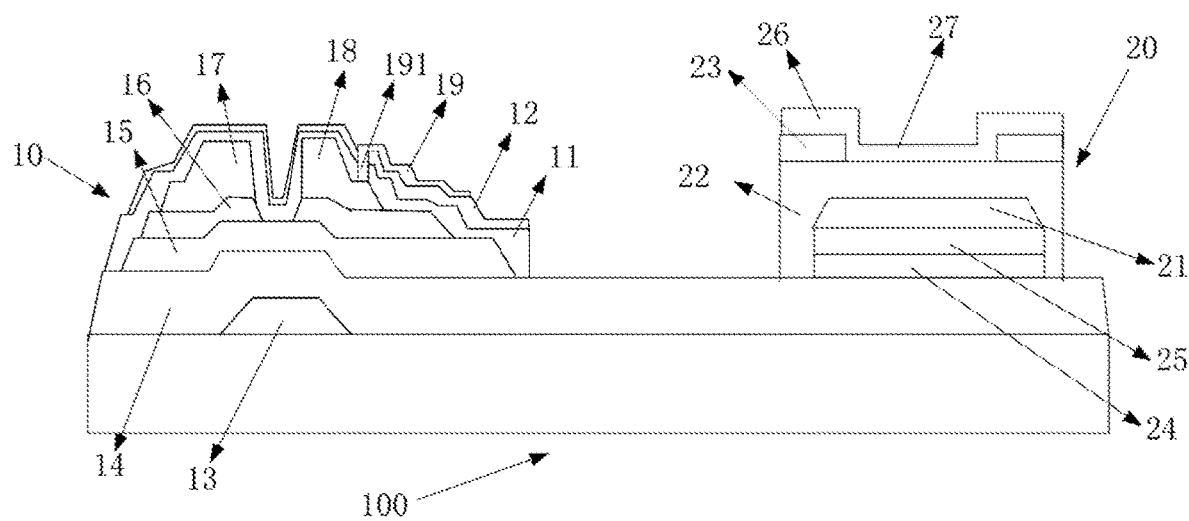
FIG. 1 is a schematic view showing an array substrate of this disclosure.
Figure 2:
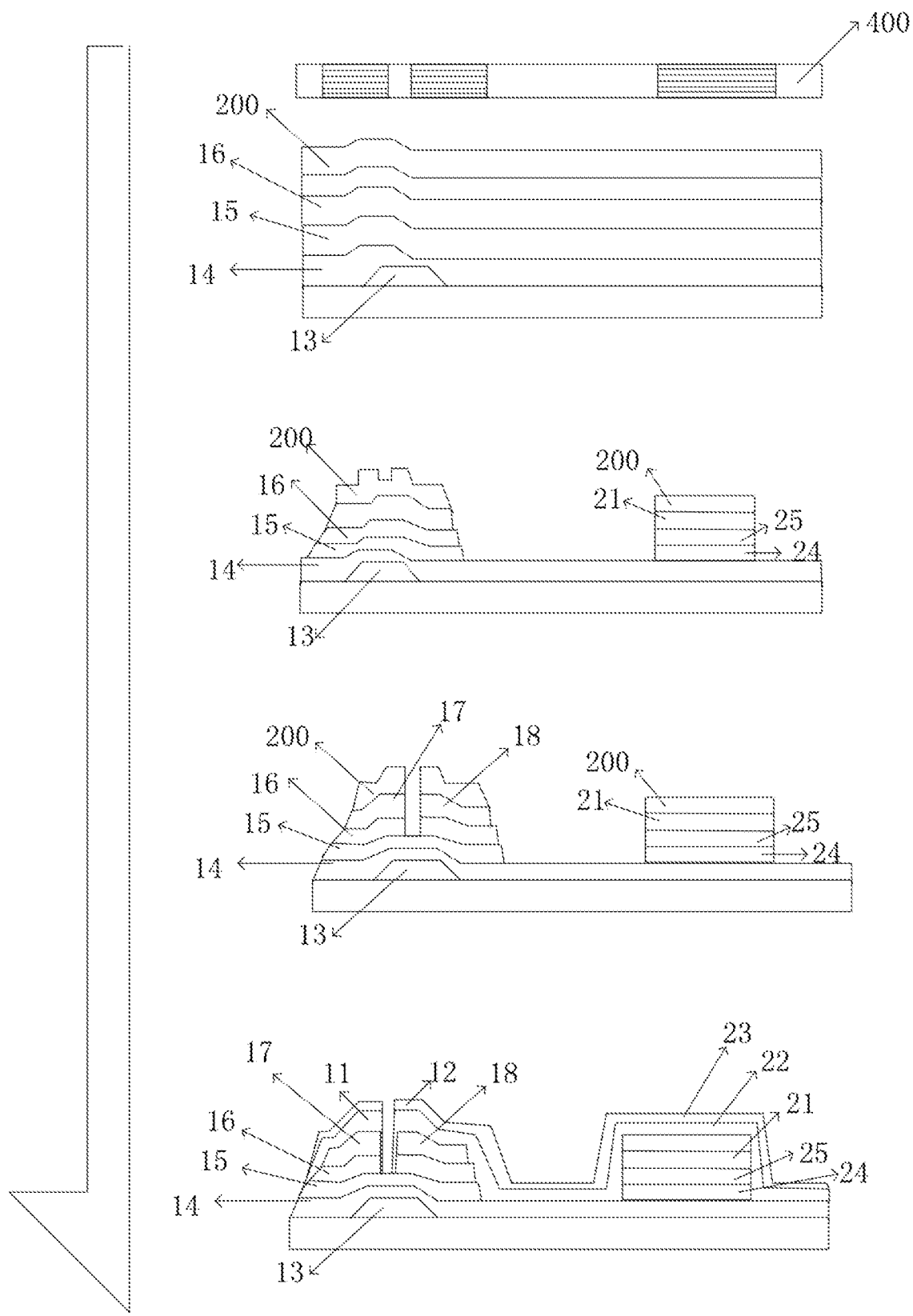
FIG. 2 is a schematic view of the first stage showing processes of manufacturing an array substrate of this disclosure.
Figure 3:
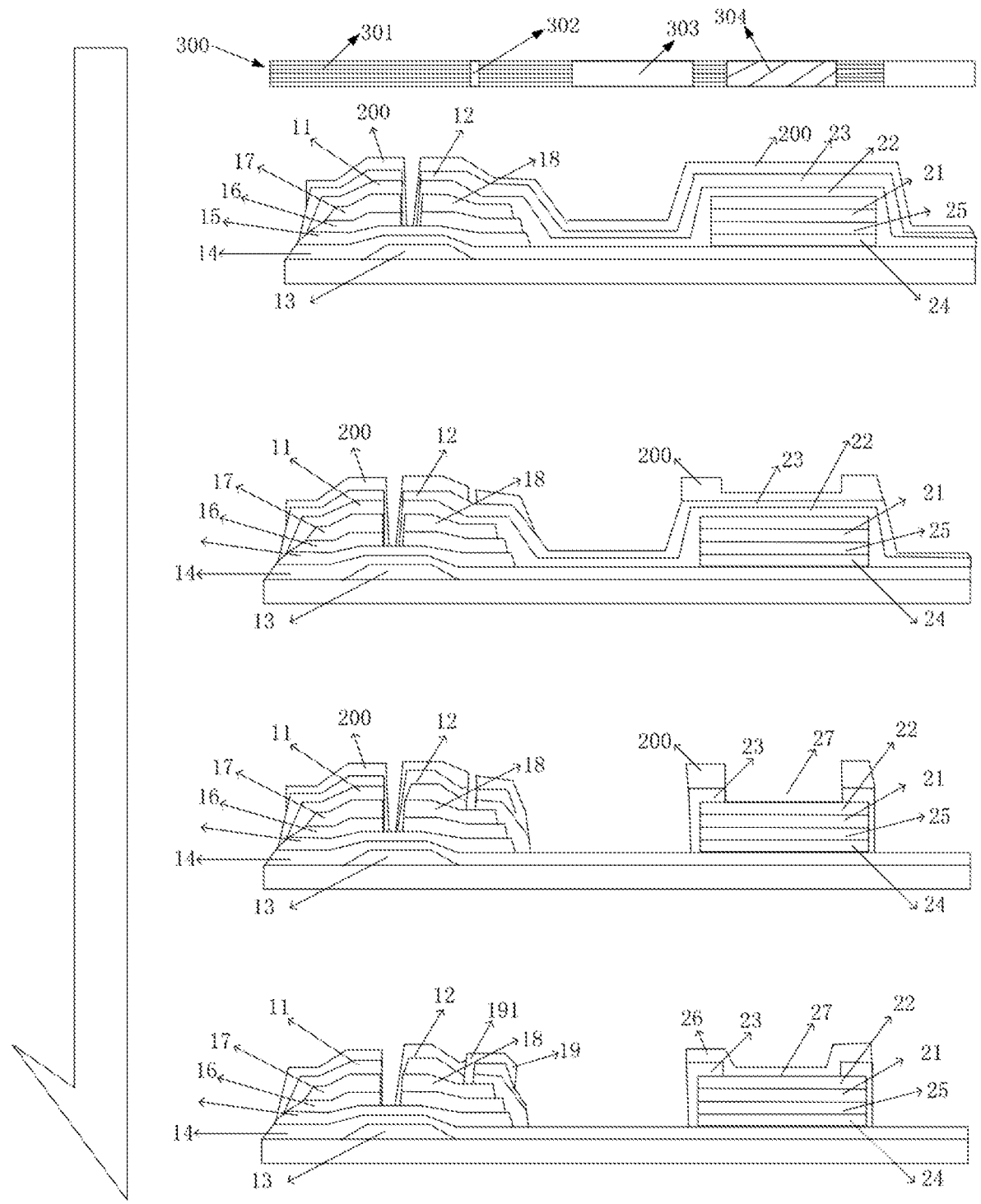
FIG. 3 is a schematic view of the second stage showing processes of manufacturing an array substrate of this disclosure.

FIG. 1 is a schematic view showing an array substrate of this disclosure; FIG. 2 is a schematic view of the first stage showing processes of manufacturing an array substrate of this disclosure; and FIG. 3 is a schematic view of the second stage showing processes of manufacturing an array substrate of this disclosure. Referring to FIGS. 1-3, the array substrate of this disclosure comprises: a substrate 100; a switch element 10 disposed on the substrate 100; a photosensor 20 disposed on the substrate 100 and one side of the switch element 10; and a light sensing metal 21 disposed at a lower portion of the photosensor 20; the switch element 10 comprises a source metal 17 and a drain metal 18 on the same layer as the light sensing metal.

In the method of manufacturing the array substrate of this disclosure, the array substrate is provided with a photosensor, and the photosensor is disposed beside the switch element. Thus, the array substrate can sense the environment changes through the photosensor. More particularly, the intensity change of the external light can be sensed. Thus, when the light ray is strong, the display can automatically adjust to increase the brightness to prevent the too dark display frame from being seen. When the light ray is weak, the brightness is correspondingly darkened to prevent the too bright frame from harshening and hurting the eyes. The switch element comprises a source metal and a drain metal, the photosensor comprises a light sensing metal, and both of them are on the same layer. Thus, when the substrate process is being performed, both of them may be formed at a time, so that the mask usage and the process steps can be decreased to increase the production efficiency.

In this embodiment, optionally, the switch element 10 comprises a first light sensing layer 11 formed on the source metal 17 and the drain metal 18, and a first passivation layer 12 formed on the first light sensing layer 11; the photosensor 20 comprises a second light sensing layer 22 formed on the light sensing metal 21, and a second passivation layer 23 formed on the second light sensing layer 22; the first light sensing layer 11 and the second light sensing layer 22 are on the same layer, and the first passivation layer 12 and the second passivation layer 23 are on the same layer.

In this embodiment, the switch element comprises a first light sensing layer and a first passivation layer, and the photosensor comprises a second light sensing layer and a second passivation layer, wherein both of them are disposed on the same layer. When the first light sensing layer, the first passivation layer, the second light sensing layer and the second passivation layer are formed, the structure of the same layer on both sides can be completed through one mask process, thereby decreasing the process waste and increasing the production efficiency.

In this embodiment, optionally, the switch element 10 comprises a gate metal 13, a gate insulating layer 14 is formed on the gate metal 13, a first amorphous silicon layer 15 and a first N-type amorphous silicon layer 16 are successively formed on the gate insulating layer 14, and the source metal 17 and the drain metal 18 are formed on the first N-type amorphous silicon layer 16; the photosensor 20 comprises a second amorphous silicon layer 24 and a second N-type amorphous silicon layer 25 formed on an extension of the gate insulating layer 14, and the light sensing metal 21 is formed on the second N-type amorphous silicon layer 25; the first amorphous silicon layer 15 and the second amorphous silicon layer 24 are on the same layer, and the first N-type amorphous silicon layer 16 and the second N-type amorphous silicon layer 25 are on the same layer.

In this embodiment, the other components of the switch element are described. The switch element is used to complete the control function of the substrate, and can perform the self-regulation according to the external environment sensing of the photosensor. With the backlight module, the brightness and contrast adjustment of the array substrate are finally completed, and the display effect is enhanced. The second amorphous silicon layer and the second N-type amorphous silicon layer are formed together with the first amorphous silicon layer and the first N-type amorphous silicon layer in the switch element to reduce the mask process, and the second amorphous silicon layer and the second N-type amorphous silicon layer also play a role of padding in the photosensor for facilitating the light sensing metal, the second light sensing layer and the second passivation layer, combined with the structure of the switch element to complete the mask process and improve production efficiency. In addition, the light sensing metal serves as the lower electrode of the photosensor as well as the light-obstructing portion to prevent the backlight from irradiating into the second light sensing layer and prevent the mis-judgement condition. The specific compositions of the first light sensing layer and the second light sensing layer are not the main application point of this disclosure, and detailed descriptions thereof will be omitted, as long as the light intensity detection can be completed.

In this embodiment, optionally, the first passivation layer 12 is formed with a first electrode layer 19 corresponding to the drain metal 18. The first passivation layer 12 is provided with a groove 191 corresponding to the drain metal 18, and the groove 191 penetrates through the first light sensing layer 11 from an upper surface of the first passivation layer 12, and extends to an upper surface of the drain metal 18. The first electrode layer 19 is fully filled into the groove 191 and extends to the upper surface of the first passivation layer 12.

In this embodiment, the first passivation layer is formed with a groove, which penetrates through the first light sensing layer and extends to an upper surface of the drain metal. Thus, the first electrode layer keeps its original function unchanged. Because the first electrode layer is connected to the drain metal, the first sensing layer, the drain metal and the first electrode layer cannot form the photosensor function, and the too-many functions, affecting the original function of the switch element, may be avoided.

In this embodiment, optionally, a second electrode layer 26 is formed on the second passivation layer 23. The second passivation layer 23 comprises a first passivation block and a second passivation block, which are disposed on two ends of an upper surface of the second light sensing layer 22, and are separately and correspondingly disposed through a through slot 27. The second electrode layer 26 is formed on the first passivation block, the second passivation block and the through slot 27.

In this embodiment, the function implementation of the photosensor includes the second light sensing layer, the second electrode layer and the light sensing lower metal layer. By sensing the electrical signal changes of the second electrode layer and the light sensing layer, it is possible to judge the light change of the external environment, thereby completing the brightness and contrast ratio regulations of the array substrate.

In this embodiment, optionally, a first electrode layer 19 is formed on the first passivation layer 12, and a second electrode layer 26 is formed on the second passivation layer 23; and the first electrode layer 19 and the second electrode layer 26 are on a same layer.

In this embodiment, the first electrode layer and the second electrode layer are on the same layer, that is, the first electrode layer and the second electrode layer can be formed through a single process, thereby reducing the waste of the process and improving the production efficiency.

In FIG. 2 and FIG. 3, the first mask 400, the second halftone mask 300 and the photoresist layer 200 play an important role; wherein the obstructing portion 301 prevents the location which needs not to be etched from being etched. The first portion 302 is used to etch the groove 191. The second portion 303 is used to etch the spacer portion between the switch element 10 and the photosensor 20. The third portion 304 is used to etch the through slot 27. The third portion 304, the first portion 302 and the second portion 303 have different transmission rates, thereby implementing different etch levels at the through slot 27 and other portions.

Figure 4:
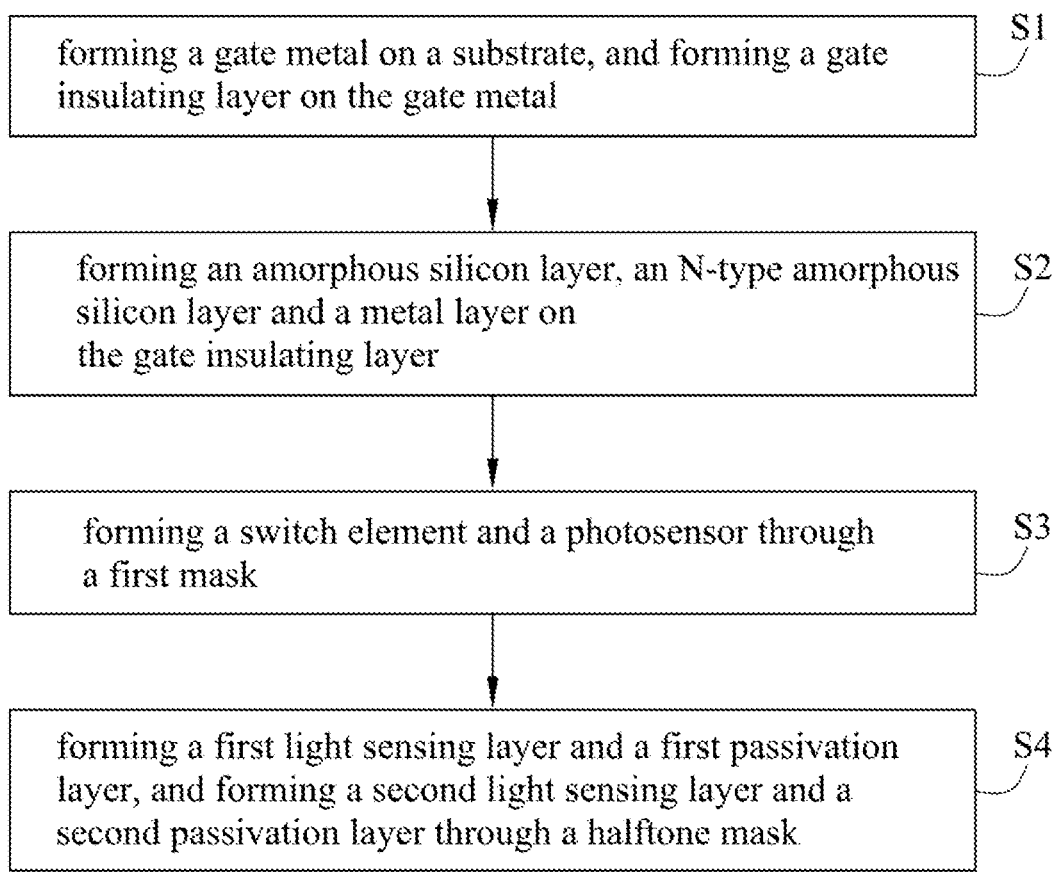
FIG. 4 is a flow chart showing a method of manufacturing an array substrate of this disclosure.

FIG. 4 is a flow chart showing a method of manufacturing an array substrate of this disclosure. As shown in FIGS. 1-3, the method comprises:

S1: forming a gate metal 13 on a substrate, and forming a gate insulating layer 14 on the gate metal 13;

S2: forming an amorphous silicon layer, an N-type amorphous silicon layer and a metal layer on the gate insulating layer 14;

S3: forming a photoresist layer 200 on the metal layer, and forming a first amorphous silicon layer 15, a first N-type amorphous silicon layer 16, and a source metal 17 and a drain metal 18 oppositely disposed on the gate metal 13 through a first mask 400 to form a switch element 10; etching on an extension of the gate insulation layer 14 to obtain a second amorphous silicon layer 24, a second N-type amorphous silicon layer 25 and a light sensing metal 21 at the same time to form a photosensor 20;

S4: forming a light sensing layer and a passivation layer on the source metal 17, the drain metal 18, and the light sensing metal 21;

forming a first light sensing layer 11 and a first passivation layer 12 on the source metal 17 and the drain metal 18, and forming a second light sensing layer 22 and a second passivation layer 23 on the light sensing metal 21 by using a second mask 300.

The array substrate obtained by the method of this disclosure includes the array substrate. The array substrate is provided with a photosensor, and the photosensor is disposed beside the switch element. Thus, the array substrate can sense the environment changes through the photosensor. More particularly, the intensity change of the external light can be sensed. Thus, when the light ray is strong, the display can automatically adjust to increase the brightness to prevent the too dark display frame from being seen. When the light ray is weak, the brightness is correspondingly darkened to prevent the too bright frame from harshening and hurting the eyes. The switch element comprises a source metal and a drain metal, the photosensor comprises a light sensing metal, and both of them are on the same layer. Thus, when the substrate process is being performed, both of them may be formed at a time, so that the mask usage and the process steps can be decreased to increase the production efficiency. In this embodiment, the switch element comprises a first light sensing layer and a first passivation layer, and the photosensor comprises a second light sensing layer and a second passivation layer, wherein both of them are disposed on the same layer. When the first light sensing layer, the first passivation layer, the second light sensing layer and the second passivation layer are formed, the structure of the same layer on both sides can be completed through one mask process, thereby decreasing the process waste and increasing the production efficiency.

In this embodiment, optionally, the step of forming the first light sensing layer 11 and the first passivation layer 12 on the source metal 17 and the drain metal 18, and forming the second light sensing layer 22 and the second passivation layer 23 on the light sensing metal 21 by using a second mask 300 further comprises: etching through the second mask 300 to clean the light sensing layer and the passivation layer between the switch element 10 and the photosensor 20 to form the first light sensing layer 11 and the first passivation layer 12 on the source metal 17 and the drain metal 18, and to form the second light sensing layer 22 and the second passivation layer 23 on the light sensing metal 21 at the same time; through the same process, etching to form a groove 191 penetrating through the first light sensing layer 11 and extending to an upper surface of the drain metal 17 on the first passivation 12 layer corresponding to the drain metal 17; etching the second passivation layer 23 to form a first passivation block and a second passivation block, which are disposed on two ends of an upper surface of the second light sensing layer 22, and are separately and correspondingly disposed through a through slot 27; the photoresist layer 200 is cleared, a first electrode layer 19 is formed on the first passivation layer 11, and a second electrode layer 26 is formed on the second passivation layer 23 through the same process.

In this embodiment, the first light sensing layer and the second light sensing layer, the first passivation layer and the second passivation layer, the groove, the through slot and the like can be completed by a mask process. Even the above several groups of the same layer of institutions can be completed by a mask process, thereby greatly reducing the mask process and enhancing the production efficiency. In addition, the second mask of this disclosure is preferably a halftone mask. When the light sensing layer, the passivation layer, the groove and the through slot are etched, the location corresponding to the through slot, the semi-permeable membrane there and the semi-permeable membrane at other hollow portions have different transmission rates, thereby implementing the difference between the etch levels of the through slot and other locations. The implementation of the difference makes the formation at the above-mentioned locations using one mask process become feasible, thereby increasing the production efficiency.

In this embodiment, optionally, the first electrode layer 19 is fully filled into the groove 191 and extends to the upper surface of the first passivation layer 12; the second electrode layer 26 is formed on the first passivation block, the second passivation block and the through slot 27; the first electrode layer 19 and the second electrode layer 26 are on a same layer; the second mask is a halftone mask.

In this embodiment, the first passivation layer is formed with a groove, which penetrates through the first light sensing layer and extends to an upper surface of the drain metal. Thus, the first electrode layer keeps its original function unchanged. Because the first electrode layer is connected to the drain metal, the first sensing layer, the drain metal and the first electrode layer cannot form the photosensor function, and the too-many functions, affecting the original function of the switch element, may be avoided. In addition, the function implementation of the photosensor includes the second light sensing layer, the second electrode layer and the light sensing lower metal layer. By sensing the electrical signal changes of the second electrode layer and the light sensing layer, it is possible to judge the light change of the external environment, thereby completing the brightness and contrast ratio regulations of the array substrate.

In the above embodiment, the array substrate of this disclosure is disposed in a display, and the display includes a liquid crystal display, an organic light-emitting diode (OLED) display, a quantum dot light emitting diodes (QLED) display, a plasma display, a flat type display, a curved display, and the like.

Although the disclosure has been described with reference to specific embodiments, this description is not meant to be construed in a limiting sense. Various modifications of the disclosed embodiments, as well as alternative embodiments, will be apparent to persons skilled in the art. It is, therefore, contemplated that the appended claims will cover all modifications that fall within the true scope of the disclosure.

What is claimed is:

1. A method of manufacturing an array substrate, comprising:
    forming a gate metal on a substrate, and forming a gate insulating layer on the gate metal;
    forming an amorphous silicon layer, an N-type amorphous silicon layer and a metal layer on the gate insulating layer;
    forming a photoresist layer on the metal layer, and forming a first amorphous silicon layer, a first N-type amorphous silicon layer, and a source metal and a drain metal oppositely disposed on the gate metal through a first mask to form a switch element; etching on an extension of the gate insulation layer to obtain a second amorphous silicon layer, a second N-type amorphous silicon layer and a metal electrode at the same time to form a photosensor;
    forming a light sensing layer and a passivation layer on the source metal, the drain metal, and the metal electrode;
    etching through a second mask to clean the light sensing layer and the passivation layer between the switch element and the photosensor to form a first light sensing layer and a first passivation layer on the source metal and the drain metal, and to form a second light sensing layer and a second passivation layer on the metal electrode at the same time; and
    the photoresist layer is cleared, a first electrode layer is formed on the first passivation layer, and a second electrode layer is formed on the second passivation layer through a same process, wherein this step comprises:
    etching the second passivation layer to form a first passivation block and a second passivation block, which are disposed on two ends of an upper surface of the second light sensing layer, and are separately and correspondingly disposed through a through slot; and
    forming the second electrode layer on the first passivation block, the second passivation block and the through slot.

2. The method of manufacturing the array substrate according to claim 1, wherein the step that the photoresist layer is cleared, the first electrode layer is formed on the first passivation layer, and the second electrode layer is formed on the second passivation layer through the same process comprises:
    etching to form a groove penetrating through the first light sensing layer and extending to an upper surface of the drain metal on the first passivation layer corresponding to the drain metal; and
    forming the first electrode layer fully filled into the groove and extending to an upper surface of the first passivation layer.

3. The method of manufacturing the array substrate according to claim 1, wherein the step that the photoresist layer is cleared, the first electrode layer is formed on the first passivation layer, and the second electrode layer is formed on the second passivation layer through the same process comprises:

etching through a same process to form a groove penetrating through the first light sensing layer and extending to an upper surface of the drain metal on the first passivation layer corresponding to the drain metal; while etching the second passivation layer to form a first passivation block and a second passivation block, which are disposed on two ends of an upper surface of the second light sensing layer, and are separately and correspondingly disposed through a through slot; and clearing the photoresist layer through the same process to form the first electrode layer on the first passivation layer, and to form the second electrode layer on the second passivation layer.

4. The method of manufacturing the array substrate according to claim 1, wherein the second mask is a halftone mask.

* * * * *